US009543892B1

(12) United States Patent
Farazian et al.

(10) Patent No.: US 9,543,892 B1
(45) Date of Patent: Jan. 10, 2017

(54) OVERLAPPING UNCOUPLED INDUCTORS FOR LOW-COST MULTI-FREQUENCY VOLTAGE-CONTROLLED OSCILLATORS

(71) Applicant: QUALCOMM Incorporated, San Diego, CA (US)

(72) Inventors: Mohammad Farazian, San Diego, CA (US); Amirpouya Kavousian, San Jose, CA (US); Alireza Khalili, Sunnyvale, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 14/801,535

(22) Filed: Jul. 16, 2015

(51) Int. Cl.
*H03B 5/08* (2006.01)
*H03B 5/12* (2006.01)
(52) U.S. Cl.
CPC ............. *H03B 5/1256* (2013.01); *H03B 5/08* (2013.01); *H03B 5/12* (2013.01)
(58) Field of Classification Search
CPC ........ H01F 5/00; H01F 17/0006; H01F 27/28; H03B 5/08; H03B 5/12
USPC ....... 331/36 L, 46, 117 FE, 117 R, 167, 181; 336/220, 225, 232
See application file for complete search history.

(56) References Cited

U.S. PATENT DOCUMENTS

| | | | |
|---|---|---|---|
| 6,549,096 B2 | 4/2003 | Groves et al. | |
| 6,621,365 B1 | 9/2003 | Hallivuori et al. | |
| 7,154,349 B2 * | 12/2006 | Cabanillas | H03B 5/1218 331/117 FE |
| 7,193,484 B2 * | 3/2007 | Maeda | H03B 5/1228 331/117 FE |
| 7,432,794 B2 | 10/2008 | Mattsson | |
| 7,460,001 B2 | 12/2008 | Jessie | |
| 7,629,859 B2 * | 12/2009 | Rai | H03B 5/1847 331/117 R |
| 7,633,352 B2 * | 12/2009 | El Rai | H03J 3/20 331/167 |
| 8,018,312 B2 | 9/2011 | Kossel et al. | |
| 8,058,934 B2 * | 11/2011 | Rangarajan | H01L 23/645 331/108 D |
| 8,339,210 B2 * | 12/2012 | Nylen | H03B 5/1852 331/117 R |

(Continued)

OTHER PUBLICATIONS

International Search Report and Written Opinion—PCT/US2016/037173—ISA/EPO—Sep. 16, 2016.

*Primary Examiner* — Levi Gannon
(74) *Attorney, Agent, or Firm* — Patterson & Sheridan, L.L.P.

(57) ABSTRACT

Certain aspects of the present disclosure provide techniques and apparatus for generating multiple oscillating signals. One example circuit generally includes a first voltage-controlled oscillator (VCO) having a first inductor and a second VCO having a second inductor in parallel with a third inductor, wherein the second and third inductors are disposed inside a loop of the first inductor and may behave as a magnetic dipole. The loop of the first inductor may be symmetrical, and a combined geometry of loops of the second and third inductors may be symmetrical. The coupling coefficient (k) between the first inductor and a combination of the second and third inductors may be small (e.g., k<0.01), due to the symmetrical geometry of the circuit layout. With a smaller k, the first and second VCOs' inductors may be placed closer to one another, thereby reducing an area consumed by the two VCOs.

31 Claims, 8 Drawing Sheets

(56) References Cited

U.S. PATENT DOCUMENTS

| | | | |
|---|---|---|---|
| 8,860,521 B2 * | 10/2014 | Ahmed | H01F 29/00 331/117 R |
| 2008/0284534 A1 * | 11/2008 | El Rai | H03B 5/02 331/117 FE |
| 2009/0289727 A1 * | 11/2009 | El Rai | H03B 5/1847 331/46 |
| 2011/0057732 A1 | 3/2011 | Taylor et al. | |
| 2011/0063038 A1 * | 3/2011 | Ainspan | H03L 7/099 331/47 |
| 2014/0218120 A1 | 8/2014 | Hekmat et al. | |
| 2014/0327487 A1 | 11/2014 | Chataigner et al. | |
| 2015/0065068 A1 | 3/2015 | Mattsson et al. | |
| 2015/0130545 A1 | 5/2015 | Chen et al. | |
| 2015/0130552 A1 | 5/2015 | Bhagat et al. | |
| 2015/0162923 A1 * | 6/2015 | Jou | H03K 3/0322 331/48 |

* cited by examiner

OVERLAPPING UNCOUPLED INDUCTORS FOR LOW-COST MULTI-FREQUENCY VOLTAGE-CONTROLLED OSCILLATORS

TECHNICAL FIELD

Certain aspects of the present disclosure generally relate to radio frequency (RF) circuits and, more particularly, to layout of inductors in voltage-controlled oscillators (VCOs).

BACKGROUND

Wireless communication networks are widely deployed to provide various communication services such as telephony, video, data, messaging, broadcasts, and so on. Such networks, which are usually multiple access networks, support communications for multiple users by sharing the available network resources. For example, one network may be a 3G (the third generation of mobile phone standards and technology) system, which may provide network service via any one of various 3G radio access technologies (RATs) including EVDO (Evolution-Data Optimized), 1×RTT (1 times Radio Transmission Technology, or simply 1×), W-CDMA (Wideband Code Division Multiple Access), UMTS-TDD (Universal Mobile Telecommunications System-Time Division Duplexing), HSPA (High Speed Packet Access), GPRS (General Packet Radio Service), or EDGE (Enhanced Data rates for Global Evolution). The 3G network is a wide area cellular telephone network that evolved to incorporate high-speed internet access and video telephony, in addition to voice calls. Furthermore, a 3G network may be more established and provide larger coverage areas than other network systems. Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, 3rd Generation Partnership Project (3GPP) Long Term Evolution (LTE) networks, and Long Term Evolution Advanced (LTE-A) networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

SUMMARY

Certain aspects of the present disclosure provide a circuit for generating multiple oscillating signals. The circuit generally includes a first VCO having a first inductor, a second inductor and a third inductor disposed inside a loop of the first inductor, and a second VCO having the second inductor connected in parallel with the third inductor.

In certain aspects, the second inductor may have the same geometry as the third inductor. In this case, the second and third inductors are configured to behave as a magnetic dipole during operation of the second VCO.

In certain aspects, the loop of the first inductor may be symmetrical and a combined geometry of a loop of the second inductor and of a loop of the third inductor is symmetrical. In this case, an axis of symmetry for the first inductor is aligned with an axis of symmetry for the combined geometry. In certain aspects, the axis of symmetry for the combined geometry may be located at one or more junctions between the second and third inductors. In certain aspects, the second VCO may comprise a capacitor located at at least one of the junctions and configured to couple an end of the second inductor to an end of the third inductor. In certain aspects, the axis of symmetry for the combined geometry divides the loop of the second inductor into two equal halves and divides the loop of the third inductor into two equal halves.

In certain aspects, a coupling coefficient between the first inductor and a combination of the second and third inductors may be less than 0.01. In certain aspects, the second and third inductors may be configured to provide an electromagnetic shield for the first inductor. In certain aspects, the second VCO, including the second and third inductors, is disposed inside the loop of the first inductor. In certain aspects, a frequency band of the first VCO at least partially overlaps with a frequency band of the second VCO.

In certain aspects, the first, second, and third inductors are located in the same plane (e.g., the same layer of an integrated circuit (IC)).

In certain aspects, the first and second inductors are configured to be concurrently active.

Certain aspects of the present disclosure provide a method for generating multiple oscillating signals. The method generally includes generating a first oscillating signal using a first VCO having a first inductor and generating a second oscillating signal using a second VCO having a second inductor in parallel with a third inductor, wherein the second and third inductors are disposed inside a loop of the first inductor.

Certain aspects of the present disclosure provide an apparatus for generating multiple oscillating signals. The apparatus generally includes means for generating a first oscillating signal using a first inductor and means for generating a second oscillating signal using a second inductor in parallel with a third inductor, wherein the second and third inductors are disposed inside a loop of the first inductor.

In certain aspects, the apparatus further includes means for capacitively coupling at least one end of the second inductor with at least one end of the third inductor.

In certain aspects, the means for generating the first oscillating signal and the means for generating the second oscillating signal are concurrently active.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the present disclosure are described below. It should be apparent that the teachings herein may be embodied in a wide variety of forms and that any specific structure, function, or both being disclosed herein is merely representative. Based on the teachings herein, one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. Furthermore, an aspect may comprise at least one element of a claim.

The word "exemplary" is used herein to mean "serving as an example, instance, or illustration." Any aspect described herein as "exemplary" is not necessarily to be construed as preferred or advantageous over other aspects.

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE) (e.g., in TDD and/or FDD modes), or some other standards. A TDMA system may implement Global System for Mobile Communications (GSM) or some other standards. These various standards are known in the art.

An Example Wireless System

Figure 1:
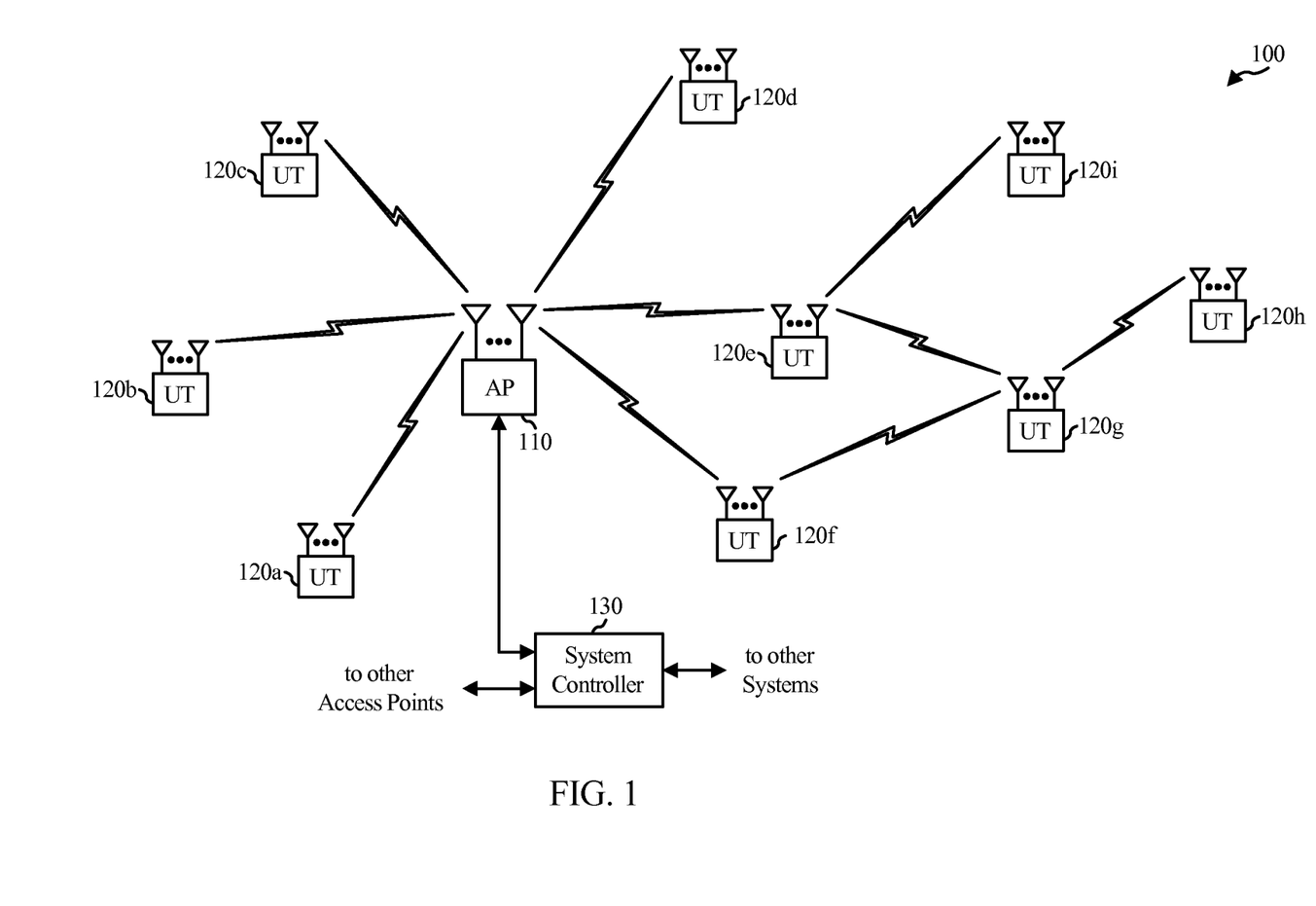
FIG. 1 is a diagram of an example wireless communications network in accordance with certain aspects of the present disclosure.

FIG. 1 illustrates a wireless communications system 100 with access points 110 and user terminals 120. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal A system controller 130 couples to and provides coordination and control for the access points.

System 100 employs multiple transmit and multiple receive antennas for data transmission on the downlink and uplink. Access point 110 may be equipped with a number Nap of antennas to achieve transmit diversity for downlink transmissions and/or receive diversity for uplink transmissions. A set Nu of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., Nut≥1). The Nu selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., in order to keep costs down) or multiple antennas (e.g., where the additional cost can be supported).

The access point 110 and/or user terminal 120 may comprise one or more frequency synthesizers to generate oscillating signals used for signal transmission and/or reception. Each frequency synthesizer may comprise multiple voltage-controlled oscillators (VCOs) configured to generate oscillating signals in different frequency bands (e.g., low frequency (LF), high frequency (HF), or ultra-high frequency (UHF)). To reduce the size of a frequency synthesizer, two or more inductors of a VCO circuit may be disposed inside a loop of an inductor of another VCO circuit, in accordance with certain aspects of the present disclosure.

Figure 2:
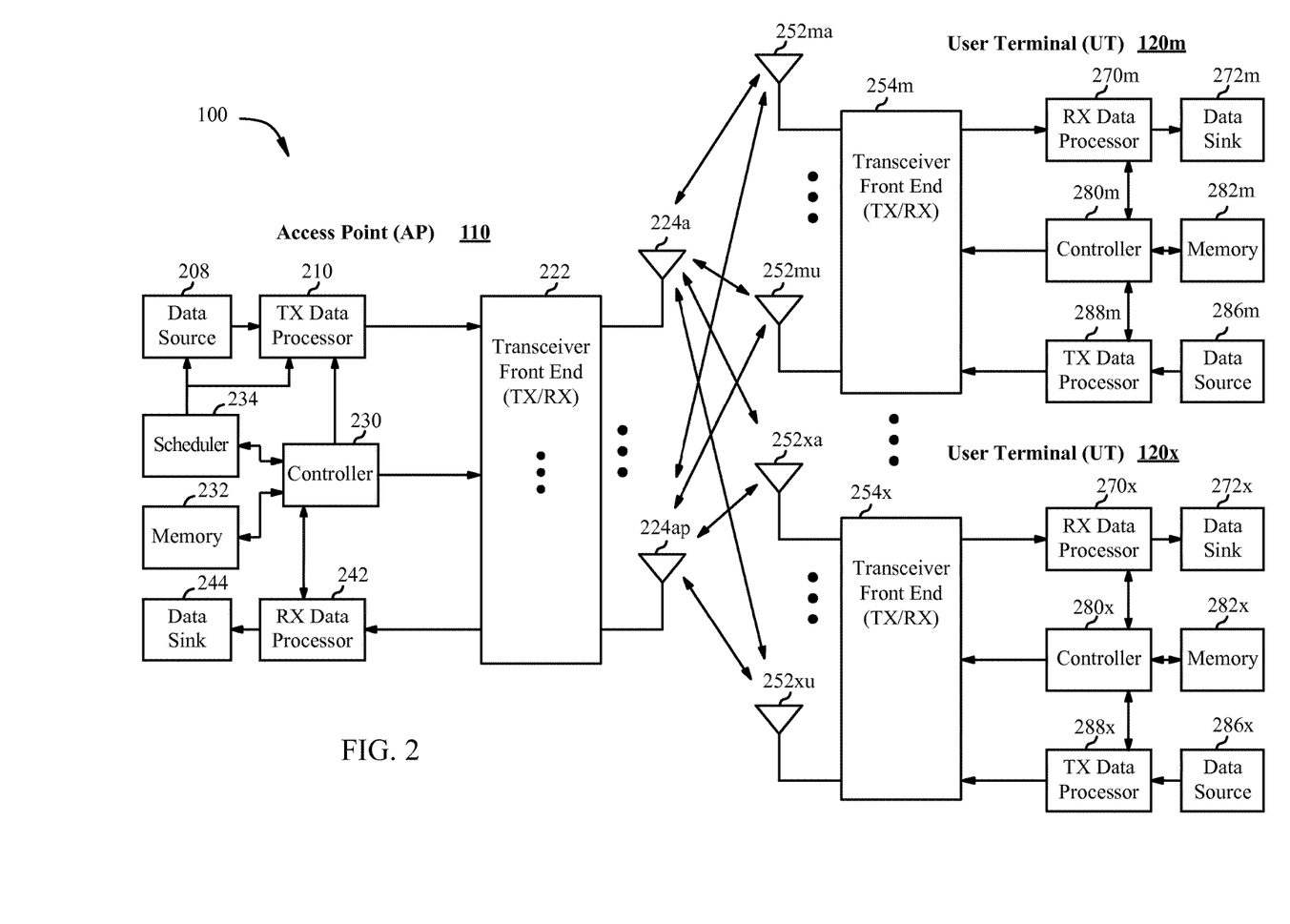
FIG. 2 is a block diagram of an example access point (AP) and example user terminals in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

The transceiver front end (TX/RX) 222 of access point 110 and/or transceiver front end 254 of user terminal 120 may comprise one or more frequency synthesizers to generate oscillating signals used for signal transmission and/or reception. Moreover, each frequency synthesizer may comprise multiple VCOs configured to generate oscillating signals in different frequency bands, as described above. To reduce the size of the frequency synthesizer, two or more inductors of a VCO circuit may be disposed inside a loop of an inductor of another VCO circuit, in accordance with certain aspects of the present disclosure.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal TX data processor 210 may provide a downlink data symbol stream for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, TD-SCDMA, and combinations thereof.

Figure 3:
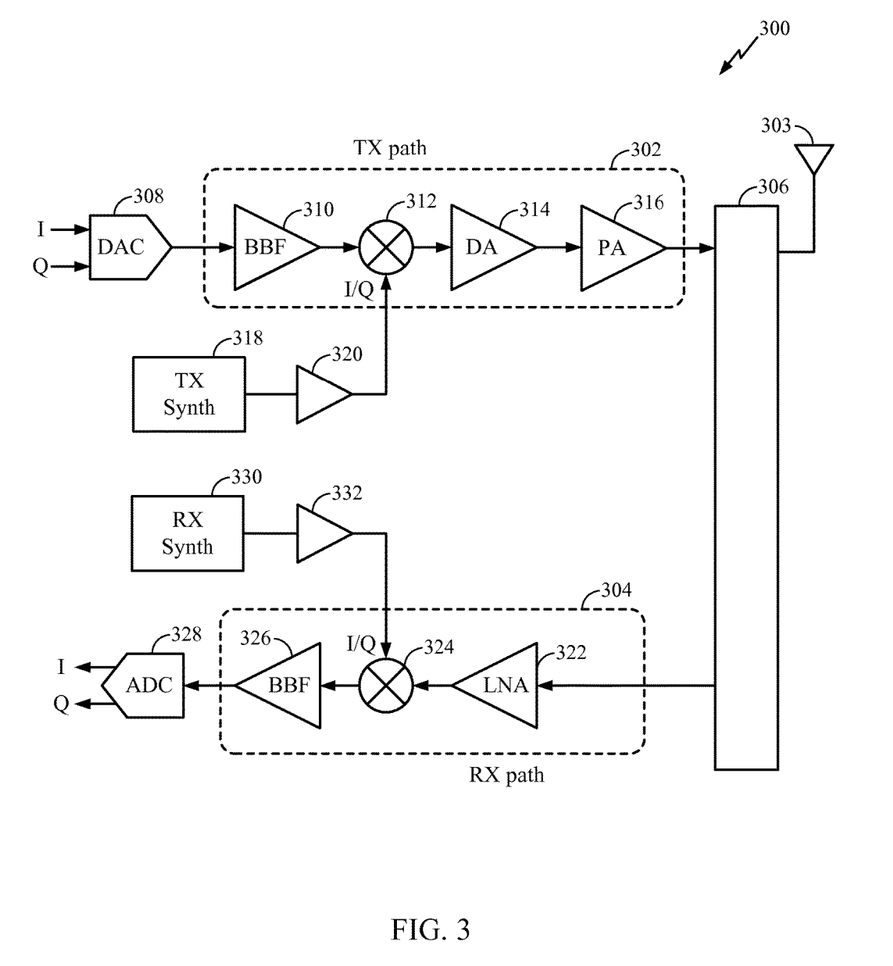
FIG. 3 is a block diagram of an example transceiver front end in accordance with certain aspects of the present disclosure.

FIG. 3 is a block diagram of an example transceiver front end 300, such as transceiver front ends 222, 254 in FIG. 2, in accordance with certain aspects of the present disclosure. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier 316. The BBF 310, the mixer 312, and the DA 314 may be included in a radio frequency integrated circuit (RFIC), while the PA 316 is often external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). Known as heterodyning, this frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which are amplified by the DA 314 and by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning to different frequencies indicates using a variable-frequency oscillator, which involves compromises between stability and tunability. Contemporary systems may employ frequency synthesizers with a VCO to generate a stable, tunable LO with a particular tuning range. Thus, the transmit LO may be produced by a TX frequency synthesizer 318, which may be buffered or amplified by amplifier 320 before being mixed with the baseband signals in the mixer 312. Similarly, the receive LO may be produced by an RX frequency synthesizer 330, which may be buffered or amplified by amplifier 332 before being mixed with the RF signals in the mixer 324.

The TX frequency synthesizer 318 and/or RX frequency synthesizer 330 may comprise multiple VCOs configured to generate oscillating signals in different frequency bands, as described above. To reduce the size of the frequency synthesizers 318 and/or 330, two or more inductors of a VCO may be disposed inside a loop of an inductor of another VCO, in accordance with certain aspects of the present disclosure.

Example Overlapping Uncoupled VCO Inductors

Multi-band mobile devices may operate using multiple voltage-controlled oscillators (VCOs) in order to cover a desired frequency range of operation. For example, to obtain a suitable trade-off between phase noise and current consumption of inductor-capacitor (LC) VCOs (e.g., VCOs with a resonant circuit, also known as a tank circuit or tuned circuit), the tuning range may be kept less than 45%. As used herein, the tuning range of a VCO is generally defined as 2*(Fmax−Fmin)/(Fmax+Fmin), where Fmin is the minimum oscillation frequency of the VCO and Fmax is the VCO's maximum oscillation frequency, typically expressed as a percentage. To keep the tuning range less than 45%, frequency synthesizers may use multiple VCOs to cover the desired frequency range. That is, multiple VCOs may be utilized to cover the frequency bandwidth in each of the TX and RX paths 302, 304. For example, a first VCO may be used to generate low-frequency signals, a second VCO may be used to generate high-frequency signals, and a third VCO may be used to generate ultra-high frequency signals. In certain cases, the same VCO may be used to generate both the low-frequency and the high-frequency signals. The number of these VCOs may increase further with carrier aggregation.

However, having multiple VCOs may occupy a significant portion of the available area in a frequency synthesizer, mainly due to the space taken by the inductor in each VCO. Moreover, placing VCOs, and their corresponding inductors, close to one another in order to reduce the size of the frequency synthesizer may increase magnetic coupling between the VCOs, which may be undesirable. Thus, certain aspects of the present disclosure provide a very compact implementation of two VCOs with a small coupling coefficient. For example, in certain aspects, three VCO inductors may be implemented effectively in the area that may otherwise be used for a single VCO inductor. Consequently, with compact implementation of two VCOs, according to the present disclosure, the size of the frequency synthesizer may be reduced with little to no interaction between the two VCOs' inductors.

Figure 4:
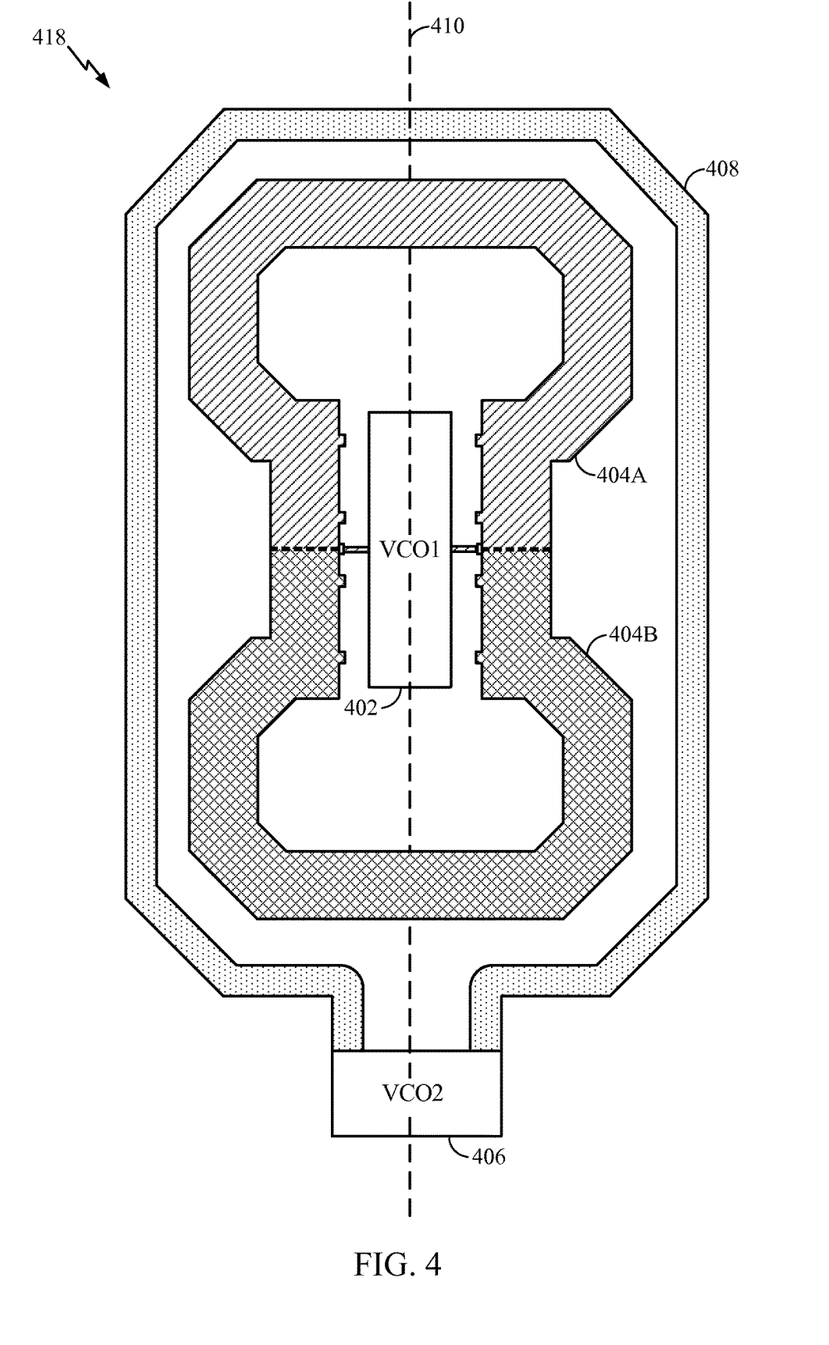
FIG. 4 illustrates an overhead view of an example layout of a first VCO circuit having first and second inductors disposed inside a loop of a third inductor of a second VCO circuit, in accordance with certain aspects of the present disclosure.

FIG. 4 illustrates an overhead view of an example layout 418 of two VCOs, in accordance with certain aspects of the present disclosure. For example, the layout 418 in FIG. 4 may illustrate a portion of a frequency synthesizer (e.g., TX frequency synthesizer 318 or RX frequency synthesizer 330) comprising a first VCO and a second VCO. The first VCO may include first VCO circuitry 402 (labeled "VCO1") connected with a first inductor 404A and a second inductor 404B in parallel (collectively "inner inductors 404"). The inner inductors 404 are part of a resonant circuit (also known as an inductor-capacitor (LC) circuit, a tank circuit, or a tuned circuit) for the first VCO. The second VCO may include second VCO circuitry 406 (labeled "VCO2") connected with a third, outer inductor 408. The VCO circuitry 402, 406 may include other portions of a VCO in addition to the inductor(s), such as the capacitive elements (e.g., varactors) of the resonant circuit, a negative active transconductance (−Gm) circuit, and any biasing circuitry.

In certain aspects for example, the first VCO may generate an oscillating signal in an ultra-high frequency (UHF) band, and the second VCO may generate an oscillating signal in at least one of a high-frequency (HF) or low-frequency (LF) band. For other aspects, the frequency bands produced by the first and second VCOs may partially overlap.

As illustrated, the inner inductors 404 are disposed inside a loop of the outer inductor 408. As an example, the loop of the outer inductor 408 may have dimensions of about 280 microns by about 430 microns. The first inductor 404A may have the same geometry as the second inductor 404B. As used herein, the geometry of an inductor generally refers to the shape and size (e.g., dimensions) of a physical implementation of the inductor, such as the implementation created when traces are routed on one or more layers of an integrated circuit (IC) or a printed circuit board (PCB), for example. Because the first and second inductors 404A, 404B have the same geometry, the combined geometry of the inner inductors 404 (e.g., the overall shape when considering the first and second inductors 404A, 404B together as a unit) may be symmetrical. Due to the symmetrical layout of this combination, the inner inductors 404 may behave as a magnetic dipole during operation of the first VCO.

Similarly, the geometry of the outer inductor 408 may be symmetrical and formed around the inner inductors 404 in a symmetrical fashion. That is, an axis of symmetry 410 for the combined geometry of the inner inductors 404 may be aligned with an axis of symmetry 410 for the outer inductor 408. Therefore, the combined geometry of the inner inductors 404 and outer inductor 408 may also be symmetrical.

Due to this geometry and symmetry, the coupling coefficient (k) between the inner inductors 404 of the first VCO and the inductor outer 408 of the second VCO may be small (e.g., k<0.01). As used herein, the term "uncoupled" in the context of inductors generally refers to the inductors having k<0.01. The inner inductors 404 may act as an electromagnetic (EM) shield for the outer inductor 408 because the inner inductors may behave as a magnetic dipole, and additional EM shielding may not be used for the inner inductors 404. Thus, not only can the area of a frequency synthesizer be reduced by including the inner inductors 404 inside the loop of the outer inductor 408, but the outer inductor 408 may also be placed in closer proximity to the inner inductors 404 to further reduce the area consumption (e.g., due to the lower coupling coefficient k).

In certain aspects, the first VCO circuitry 402 may be located inside a loop of the inner inductors 404 to reduce the area consumption of the layout 418 (and, in turn, the frequency synthesizer) as illustrated. The second VCO circuitry 406 may be located adjacent one end of the two-dimensional dumbbell shape created by the loop of the inner inductors 404 (e.g., disposed laterally outside the winding of the second inductor 404B, as illustrated in FIG. 4). For other aspects, the second VCO circuitry 406 may be located adjacent an opposite end of the dumbbell shape formed by the loop of the inner inductors 404 without altering the symmetry of the outer inductor 408 (e.g., by effectively rotating the layout 418 180°).

In addition, the inductance (L) and quality factor (Q) of the outer inductor 408 remain practically unchanged as a result of the geometry of the layout 418, compared to use of the outer inductor 408 without the inner inductors 404. For example, the Q of the outer inductor 408 may be affected in two ways by introducing the inner inductors 404. The EM shield created by the inner inductors 404 may reduce the Q of the outer inductor 408 (e.g., by roughly 20%). With the layout 418, however, a single-turn, relatively larger area implementation of the outer inductor 408 may be used, which may increase the Q of the outer inductor 408 (e.g., by at least 20%), and therefore, the overall impact on the Q of the outer inductor 408 may be small.

Figure 5:
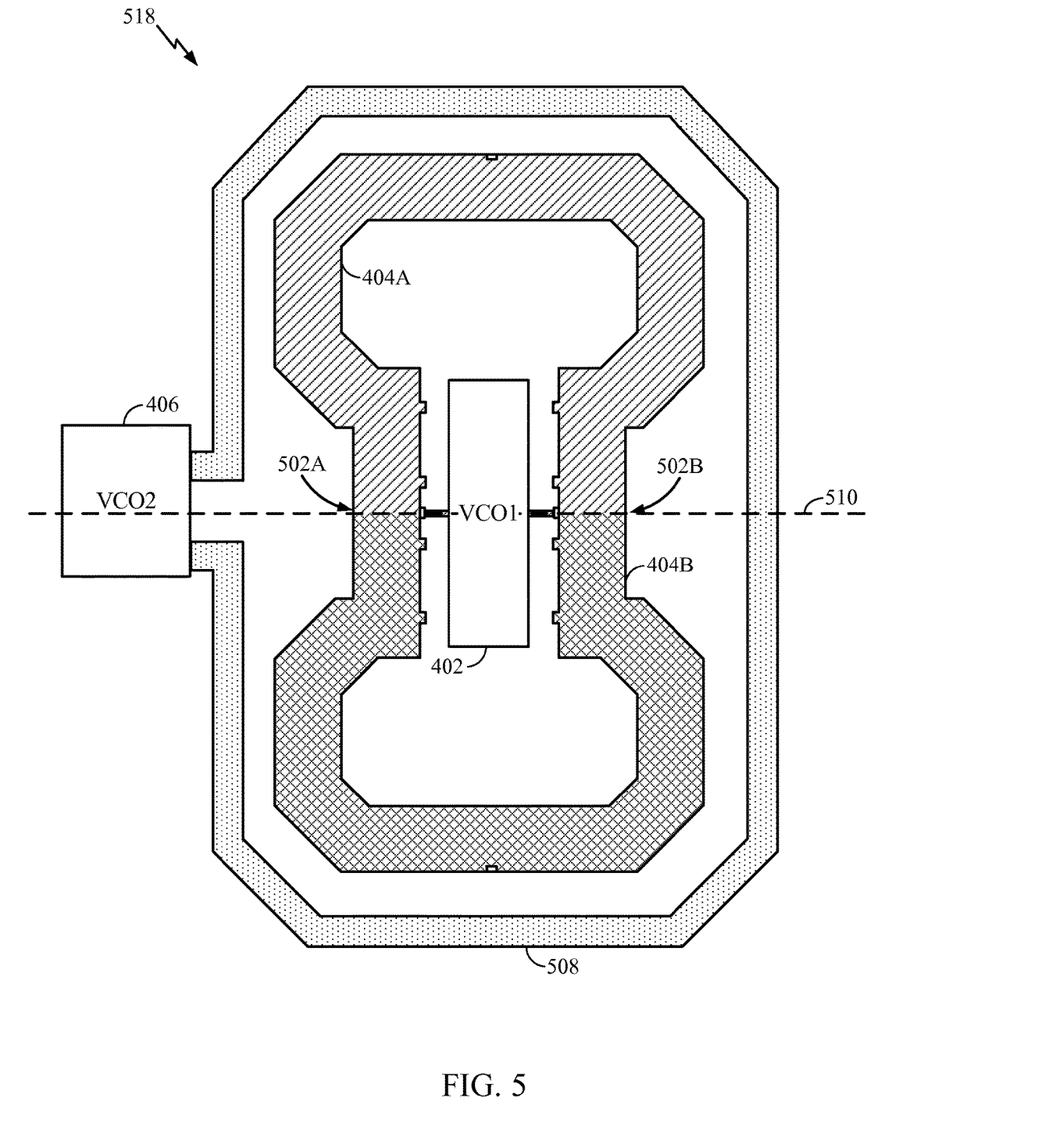
FIG. 5 illustrates an overhead view of another example layout with the components of FIG. 4, where the loop of the third inductor has been rotated, in accordance with certain aspects of the present disclosure.

FIG. 5 illustrates another example layout 518 of the two VCO circuits of FIG. 4, in accordance with certain aspects of the present disclosure. As illustrated, the second VCO circuitry 406 may be located adjacent either side of the dumbbell shape's "handle" created by the loop of the inner inductors 404 (as opposed to the ends of the dumbbell shape as in FIG. 4) such that an axis of symmetry 510 for the combined geometry of the inner inductors 404 (e.g., located at junctions 502A, 502B between the first and second inductors 404A, 404B) is the same as the axis of symmetry for the outer inductor 508. With the layout 518 as illustrated in FIG. 5, the symmetry of the inner inductors 404 and the outer inductor 508 may be increased, which may result in a lower coupling coefficient k, as compared to the layout 418 of FIG. 4. Moreover, the layout 518 of FIG. 5 may achieve an area savings similar to the layout 418 of FIG. 4.

Figure 6:
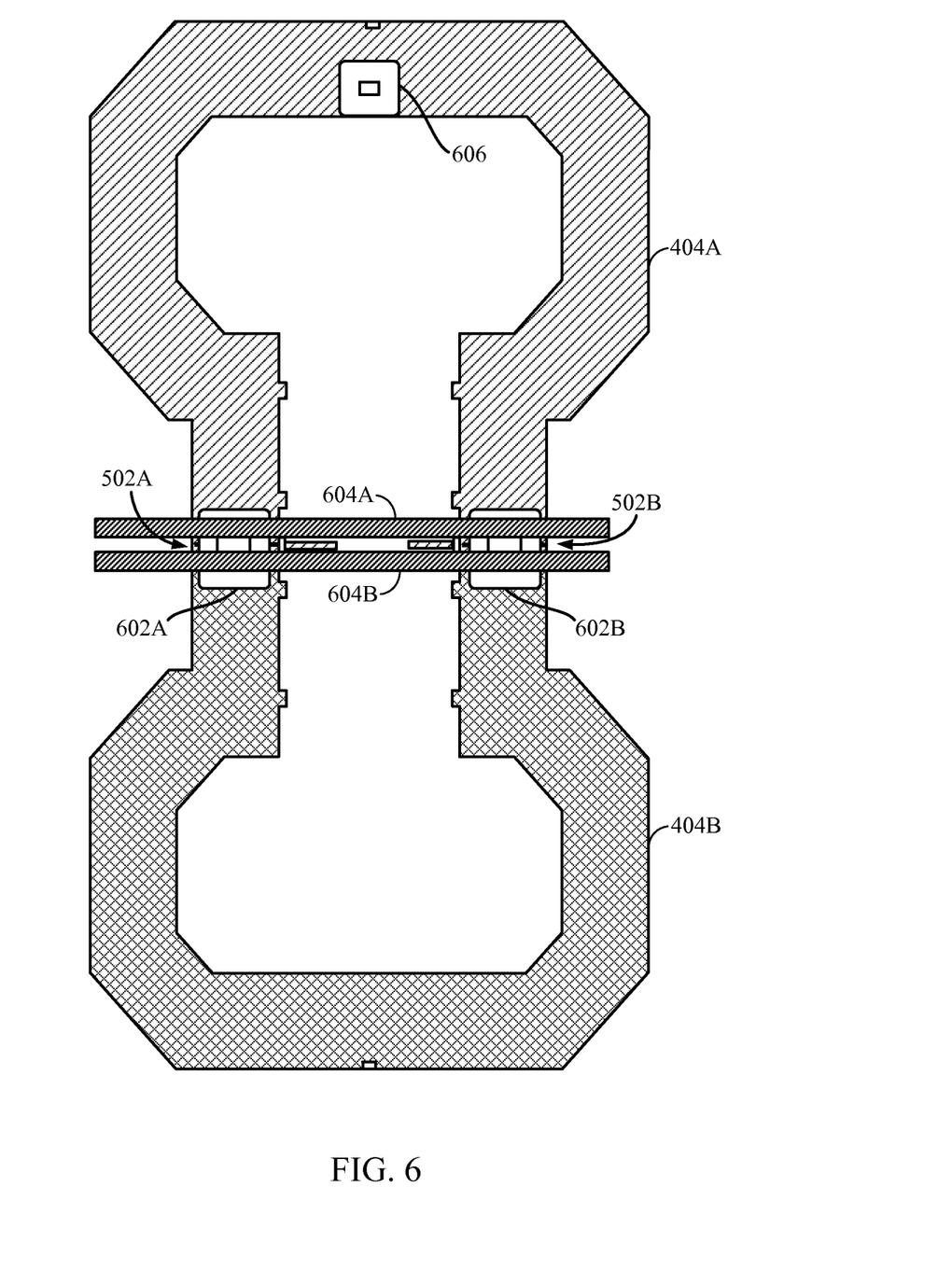
FIG. 6 illustrates the first and second inductors of FIG. 4 with alternating current (AC) coupling capacitors located at junctions between the first and second inductors and with outputs of the first VCO circuit routed horizontally, in accordance with certain aspects of the present disclosure.
Figure 7:
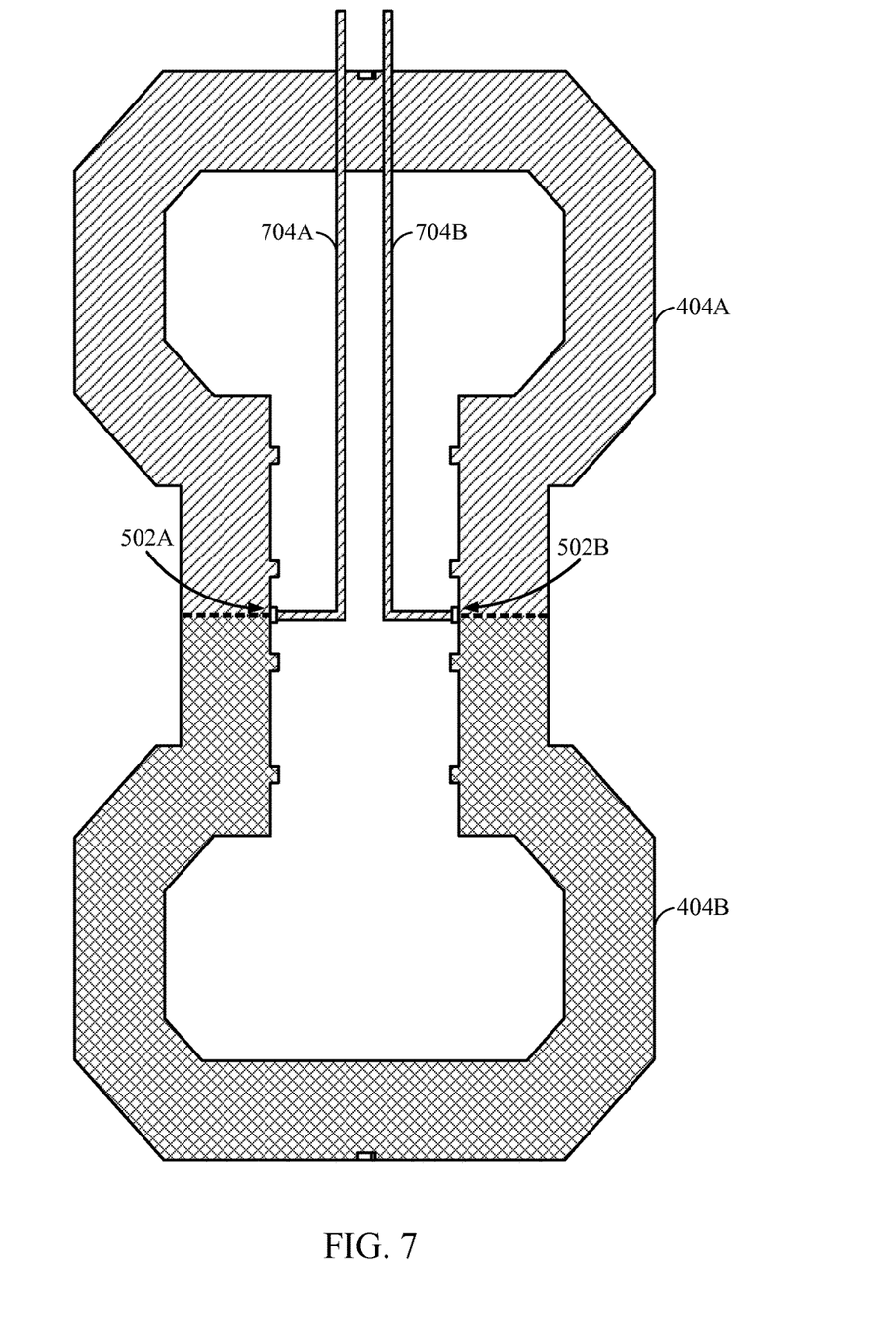
FIG. 7 illustrates the first and second inductors of FIG. 4 with outputs of the first VCO circuit routed vertically out of a loop of the first or second inductor, in accordance with certain aspects of the present disclosure.

As illustrated in FIG. 6, alternating current (AC) coupling capacitors 602A and 602B may be located at or near the junctions 502A and 502B, respectively, between the first and second inductors 404A, 404B, according to certain aspects of the present disclosure. That is, the AC coupling capacitors 602A, 602B may be configured to capacitively couple ends of the first inductor 404A with ends of the second inductor 404B. Moreover, an AC ground connection 606 may be made with at least one of the first inductor 404A (as shown in FIG. 6) or the second inductor 404B. As illustrated in FIG. 6, outputs of VCO circuitry (e.g., first VCO circuitry 402) inside the inner inductors 404 may be routed perpendicular to an axis of the dumbbell shape's handle out of the loop of the inner inductors 404, via traces 604A and 604B. Alternatively, as illustrated in FIG. 7, the outputs of VCO circuitry (e.g., circuitry 402) inside the inner inductors 404 may be routed, via traces 704A and 704B, parallel to the axis of the dumbbell shape's handle out of the loop of the inner inductors 404 (in either or both directions).

While examples presented herein describe an arrangement of two VCO circuits to facilitate understanding, a person of ordinary skill in the art will understand that the ideas disclosed herein may be applied to more than two VCO circuits, such as in frequency synthesizers with three or four VCO circuits.

Figure 8:
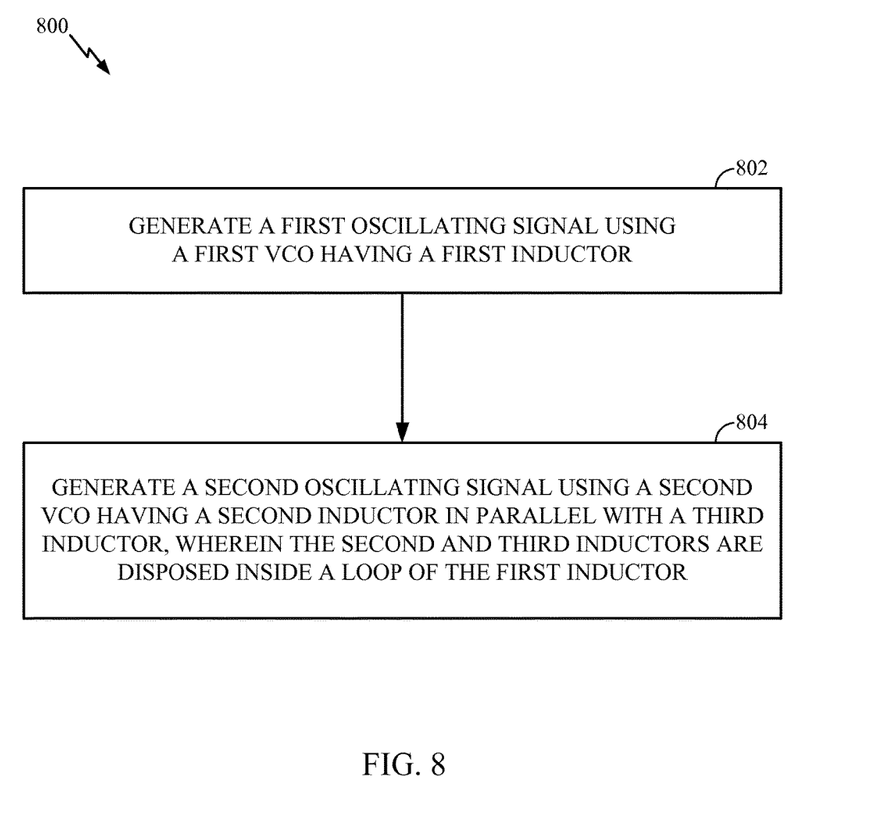
FIG. 8 is a flow diagram of example operations for generating multiple oscillating signals, in accordance with certain aspects of the present disclosure.

FIG. 8 is a flow diagram of example operations 800 for generating multiple oscillating signals, in accordance with certain aspects of the present disclosure. The operations 800 may be performed by an apparatus (e.g., a frequency synthesizer) comprising at least two VCOs.

The operations 800 may begin, at block 802, with the apparatus generating a first oscillating signal using a first VCO having a first inductor (outer inductor 408). At block 804, the apparatus may generate a second oscillating signal using a second VCO having a second inductor (e.g., the first inductor 404A) in parallel with a third inductor (e.g., the second inductor 404B). The second and third inductors are disposed inside a loop of the first inductor. For certain aspects, generating the first oscillating signal at block 802 occurs concurrently with generating the second oscillating signal at block 804.

According to certain aspects, the second inductor has the same geometry as the third inductor (e.g., as illustrated in FIGS. 4-7). For certain aspects, generating the second oscillating signal using the second VCO at block 804 may involve the second and third inductors behaving as a magnetic dipole.

According to certain aspects, the loop of the first inductor may be symmetrical. Furthermore, a combined geometry of a loop of the second inductor and of a loop of the third inductor may be symmetrical. In this case, an axis of symmetry (e.g., axis of symmetry 410, 510) for the first inductor may be aligned with an axis of symmetry for the combined geometry. For certain aspects, the axis of symmetry for the combined geometry may divide the loop of the second inductor into two equal halves and may divide the loop of the third inductor into two equal halves. The axis of symmetry for the combined geometry may be located at or near a junction between the second and third inductors. For certain aspects, the operations 800 further involve capacitively coupling an end of the second inductor with an end of the third inductor using at least one capacitor located at or near the junction.

According to certain aspects, a coupling coefficient between the first inductor and a combination of the second and third inductors is less than 0.01.

According to certain aspects, the operations 800 may further involve electromagnetically shielding the first inductor with the second and third inductors (e.g., using the second and third inductors as an EM shield for the first inductor).

According to certain aspects, the second VCO, including the second and third inductors, is disposed inside the loop of the first inductor (e.g., as illustrated in FIGS. 4 and 5).

According to certain aspects, a frequency band of the first VCO at least partially overlaps with a frequency band of the second VCO. For other aspects, the frequency band of the first VCO does not overlap with the frequency band of the second VCO.

According to certain aspects, the first, second, and third inductors are located in the same plane (e.g., the same layer of an integrated circuit (IC) or printed circuit board (PCB)).

The various operations or methods described above may be performed by any suitable means capable of performing the corresponding functions. The means may include various hardware and/or software component(s) and/or module (s), including, but not limited to a circuit, an application-specific integrated circuit (ASIC), or processor. Generally, where there are operations illustrated in figures, those operations may have corresponding counterpart means-plus-function components with similar numbering.

For example, means for transmitting may comprise a transmitter (e.g., the transceiver front end 254 of the user terminal 120 depicted in FIG. 2 or the transceiver front end 222 of the access point 110 shown in FIG. 2) and/or an antenna (e.g., the antennas 252ma through 252mu of the user terminal 120m portrayed in FIG. 2 or the antennas 224a through 224ap of the access point 110 illustrated in FIG. 2). Means for receiving may comprise a receiver (e.g., the transceiver front end 254 of the user terminal 120 depicted in FIG. 2 or the transceiver front end 222 of the access point 110 shown in FIG. 2) and/or an antenna (e.g., the antennas 252ma through 252mu of the user terminal 120m portrayed in FIG. 2 or the antennas 224a through 224ap of the access point 110 illustrated in FIG. 2). Means for processing or means for determining may comprise a processing system, which may include one or more processors, such as the RX data processor 270, the TX data processor 288, and/or the controller 280 of the user terminal 120 illustrated in FIG. 2. Means for generating an oscillating signal may comprise an oscillator (e.g., a VCO depicted in FIG. 4 or 5). Means for capacitively coupling may comprise a capacitor (e.g., AC coupling capacitors 602A, 602B portrayed in FIG. 6).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A circuit for generating multiple oscillating signals, comprising:
   a first voltage-controlled oscillator (VCO) having a first inductor;
   a second inductor and a third inductor disposed inside a loop of the first inductor; and
   a second VCO having the second inductor connected in parallel with the third inductor, wherein a first output of the second VCO is coupled to a first terminal of the second and third inductors, and wherein a second output of the second VCO is coupled to a second terminal of the second and third inductors.

2. The circuit of claim 1, wherein the second inductor has a same geometry as the third inductor.

3. The circuit of claim 2, wherein the second and third inductors are configured to behave as a magnetic dipole during operation of the second VCO.

4. The circuit of claim 1, wherein:
the loop of the first inductor is symmetrical; and
a combined geometry of a loop of the second inductor and of a loop of the third inductor is symmetrical.

5. The circuit of claim 4, wherein an axis of symmetry for the first inductor is aligned with an axis of symmetry for the combined geometry.

6. The circuit of claim 5, wherein the axis of symmetry for the combined geometry is located at one or more junctions between the second and third inductors.

7. The circuit of claim 6, wherein the second VCO further comprises a capacitor located at at least one of the junctions and configured to couple an end of the second inductor to an end of the third inductor.

8. The circuit of claim 5, wherein the axis of symmetry for the combined geometry divides the loop of the second inductor into two equal halves and divides the loop of the third inductor into two equal halves.

9. The circuit of claim 1, wherein a coupling coefficient between the first inductor and a combination of the second and third inductors is less than 0.01.

10. The circuit of claim 1, wherein the second and third inductors are configured to provide an electromagnetic shield for the first inductor.

11. The circuit of claim 1, wherein the second VCO, including the second and third inductors, is disposed inside the loop of the first inductor.

12. The circuit of claim 1, wherein a frequency band of the first VCO at least partially overlaps with a frequency band of the second VCO.

13. The circuit of claim 1, wherein the first, second, and third inductors are located in a same plane.

14. The circuit of claim 1, wherein the first and second inductors are configured to be concurrently active.

15. A method for generating multiple oscillating signals, comprising:
generating a first oscillating signal using a first voltage-controlled oscillator (VCO) having a first inductor; and
generating a second oscillating signal using a second VCO having a second inductor in parallel with a third inductor, wherein the second and third inductors are disposed inside a loop of the first inductor, wherein the first inductor is uncoupled between a combination of the second and third inductors.

16. The method of claim 15, wherein the second inductor has a same geometry as the third inductor.

17. The method of claim 16, wherein generating the second oscillating signal using the second VCO comprises the second and third inductors behaving as a magnetic dipole.

18. The method of claim 15, wherein:
the loop of the first inductor is symmetrical; and
a combined geometry of a loop of the second inductor and of a loop of the third inductor is symmetrical.

19. The method of claim 18, wherein an axis of symmetry for the first inductor is aligned with an axis of symmetry for the combined geometry.

20. The method of claim 19, wherein the axis of symmetry for the combined geometry is located at a junction between the second and third inductors.

21. The method of claim 20, further comprising coupling an end of the second inductor with an end of the third inductor using at least one capacitor located at the junction.

22. The method of claim 15, wherein a coupling coefficient between the first inductor and a combination of the second and third inductors is less than 0.01.

23. The method of claim 15, further comprising electromagnetically shielding the first inductor with the second and third inductors.

24. The method of claim 15, wherein the second VCO, including the second and third inductors, is disposed inside the loop of the first inductor.

25. The method of claim 15, wherein a frequency band of the first VCO does not overlap with a frequency band of the second VCO.

26. The method of claim 15, wherein the first, second, and third inductors are located in a same plane.

27. The method of claim 15, wherein generating the first oscillating signal occurs concurrently with generating the second oscillating signal.

28. An apparatus for generating multiple oscillating signals, comprising:
means for generating a first oscillating signal using a first inductor; and
means for generating a second oscillating signal using a second inductor in parallel with a third inductor, wherein the second and third inductors are disposed inside a loop of the first inductor, wherein the second and third inductors are configured to provide an electromagnetic shield for the first inductor.

29. The apparatus of claim 28, further comprising means for capacitively coupling at least one end of the second inductor with at least one end of the third inductor.

30. The apparatus of claim 28, wherein the means for generating the first oscillating signal and the means for generating the second oscillating signal are concurrently active.

31. The apparatus of claim 28, wherein a first output terminal of the means for generating a second oscillating signal is coupled to a first terminal of the second and third inductors, and wherein a second output terminal of the means for generating a second oscillating signal is coupled to a second terminal of the second and third inductors.

* * * * *